US006853571B2

(12) United States Patent
Doller

(10) Patent No.: US 6,853,571 B2
(45) Date of Patent: Feb. 8, 2005

(54) STACKED NON-VOLATILE MEMORY DEVICE AND METHOD OF MAKING THE SAME

(75) Inventor: Edward M. Doller, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 10/225,049

(22) Filed: Aug. 20, 2002

(65) Prior Publication Data

US 2004/0037111 A1 Feb. 26, 2004

(51) Int. Cl.$^7$ ................................................ G11C 7/00
(52) U.S. Cl. .............................. 365/63; 365/51; 365/72; 361/760
(58) Field of Search ............................. 365/63, 51, 72; 361/760

(56) References Cited

U.S. PATENT DOCUMENTS

| 6,337,634 | B1 | * | 1/2002 | O'Toole et al. ........ 340/825.56 |
| 6,404,648 | B1 | * | 6/2002 | Slupe et al. ................. 361/760 |
| 6,462,976 | B1 | * | 10/2002 | Olejniczak et al. ......... 363/147 |
| 2003/0143971 | A1 | * | 7/2003 | Hongo et al. ................ 455/313 |

FOREIGN PATENT DOCUMENTS

JP          02000031377 A  *  1/2000  ......... H01L/25/065

* cited by examiner

Primary Examiner—Viet Q. Nguyen
(74) Attorney, Agent, or Firm—Blakely, Sokoloff, Taylor & Zafman LLP

(57) ABSTRACT

Briefly, in accordance with one embodiment of the invention, a first integrated circuit having control circuitry is bonded to a second integrated circuit having a memory array. The control circuitry of the first integrated circuit being adapted to access, at least in part, data stored in the memory array of the second integrated circuit.

26 Claims, 4 Drawing Sheets

STACKED NON-VOLATILE MEMORY DEVICE AND METHOD OF MAKING THE SAME

BACKGROUND

As wireless computing devices, such as, for example, cellular phones, personal digital assistants (PDA's), mobile computers, etc. include additional features, it may be desirable to increase the amount of volatile and/or non-volatile memory in the wireless computing device. The memory may be used to store any combination of data and instructions used during the operation of the wireless computing device.

However, in general, an increase the amount of memory in a computing device involves physically increasing the size of the memory. This, in turn, may increase the footprint or amount of space that is occupied in the wireless computing devices.

Thus, there is a continuing need to increase the amount of memory that may be placed in a portable computing device will addressing the overall space occupied by the memory.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
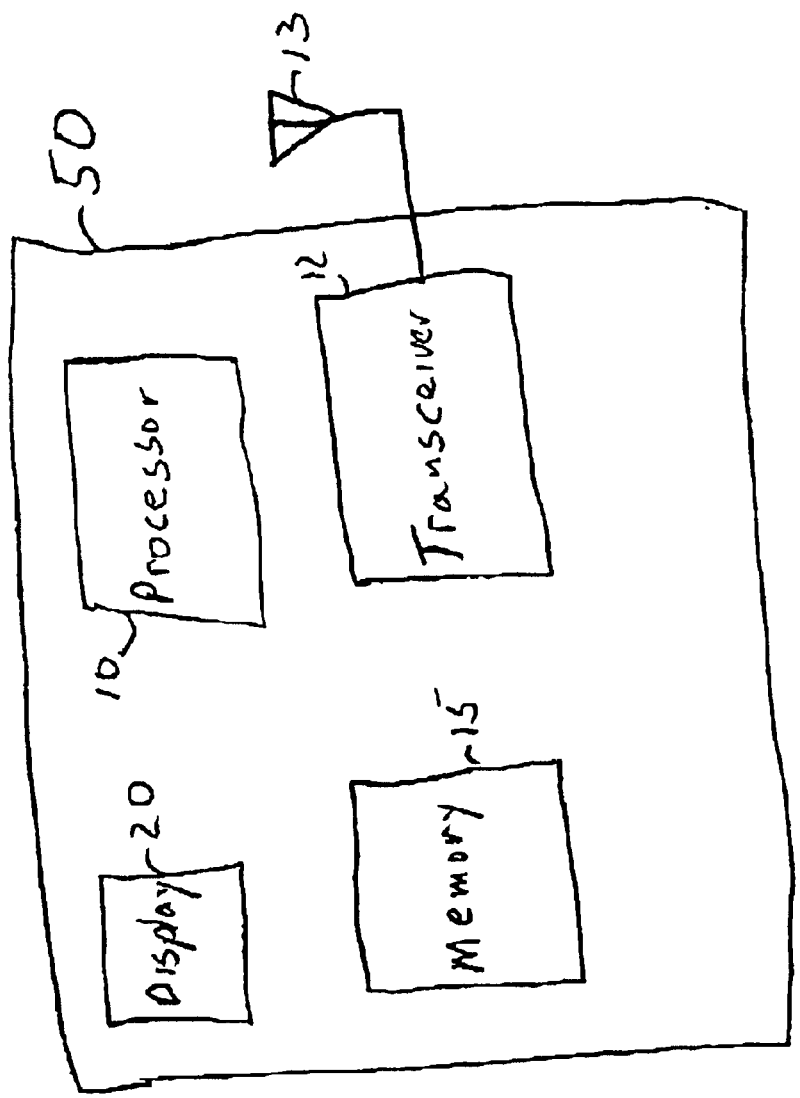
FIG. 1 is a block diagram of a computing system in accordance with an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, cellular radiotelephone communication systems, satellite communication systems, two-way radio communication systems, one-way pagers, two-way pagers, personal communication systems (PCS), personal digital assistants (PDA's) and the like.

Types of cellular radiotelephone communication systems intended to be within the scope of the present invention include, although not limited to, Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

Turning to FIG. 1, an embodiment 100 in accordance with the present invention is described. Embodiment 100 may comprise a computing system 50 such as, for example, a portable device such as a mobile communication device (e.g., cell phone), a two-way radio communication system, a one-way pager, a two-way pager, a personal communication system (PCS), a portable computer, or the like. Although it should be understood that the scope and application of the present invention is in no way limited to these examples.

Computing system 50 here includes a display 20 to provide information to a user, a memory 15, and a processing unit 10 that may comprise one or more integrated circuits, although the scope of the present invention is not limited in this respect. Processing unit 10 may comprise, for example, a microprocessor, a digital signal processor, a microcontroller, or the like. Simply stated, processing unit may be used to execute instructions to provide information or communications to a user. Instructions to be executed by processing unit may be stored in memory 15, although the scope of the present invention is not limited in this respect.

Memory 15 may comprise, for example, disk including floppy disks, optical disks, CD-ROMs, magnetic-optical disks, read-only memories (ROMs), random access memories (RAMs) such as dynamic RAM (DRAM) or static RAM (SRAM), electrically programmable read-only memories (EPROMs), electrically erasable and programmable read only memories (EEPROMs), a flash memory array, magnetic or optical cards, or any other type of media suitable for storing electronic instructions.

Computing device 50 may also include a transceiver 12 and an antenna 13 to provide wireless communication with other devices. Although the scope of the present invention is not limited in this respect, transceiver 12 may permit computing device 50 to communicate using one of the communication standards listed above. Alternatively, computing device 50 may include hardware to permit computing device 50 to communicate with or as part of a wireless local area network (WLAN).

Figure 2:
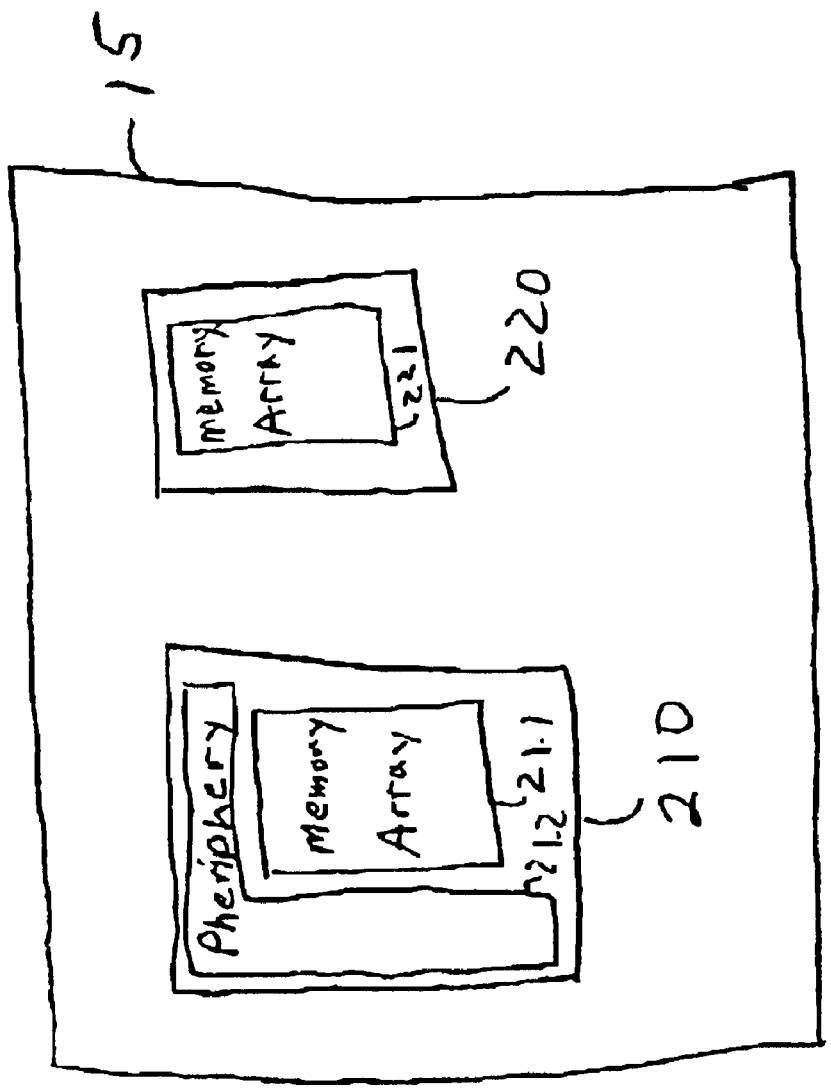
FIG. 2 is a cross-sectional representation of transistors in accordance with an embodiment of the present invention.

Turning to FIG. 2, an embodiment 200 is illustrated to provide memory 15, although it should be understood that the scope of the present invention is not limited to this particular embodiment. As illustrated, memory 15 may comprise two integrated circuits 210 and 220, although in alternative embodiments, memory 15 may comprise three or more integrated circuit. In this particular example, integrated circuit 210 may comprise a memory array 211 and periphery circuitry 212.

Memory array 210 may comprises any combination of volatile or non-volatile memory cells including, but not limited, any of the types described above. For example, memory array 211 may comprise flash memory cells or static random access memory cells. Although the scope of the present invention is not limited in this respect, memory array 211 may be uniform and be made of memory cells of the same type (i.e. all flash memory, all SRAM cells, etc.) or comprise any combination of volatile or non-volatile memory cells. For illustrative purposes only, in this particular embodiment, memory array 211 may comprise flash memory cells.

Peripheral circuitry 212 may comprised circuitry used to read or write information into memory cells in memory array 211, although the scope of the present invention is not limited in this respect. For example, peripheral circuitry 212 may comprise circuitry associated with operations associated with memory arrays such as address decoding, address and or data latching, bussing, clocking, synchronizing, security, power supply potentials, program and/or erasing voltage potentials, electrostatic discharge (ESD) protection, error code correction (ECC), input/output (I/O) buffering, etc.

As shown in FIG. 2, in this particular embodiment, integrated circuit may comprise a memory array 221 that may be controlled or accessed, at least in party, by peripheral circuitry 212 of integrated circuit 210. A will be explained in more detail below, integrated circuit 220 may be electrically connected to integrated circuit 210 such that peripheral circuitry 212 may be operatively coupled to a memory array 221 in integrated circuit 220. For example, although the scope of the present invention is not limited in this respect, integrated circuit 220 may be connected to integrated circuit 210 so that peripheral circuitry 212 may be used to perform some or all of the operations with memory array 221 peripheral circuitry 212 performs with memory array 211.

In this particular embodiment, memory array 221 of integrated circuit 220 may comprise flash memory of the same type in memory array 211. Further, memory 15 may be arranged such that memory arrays 211 and 221 are mapped sequentially to each other so that they are logically adjacent to each other in an address map, although the scope of the present invention is not limited in this respect. This may be done, for example, by using decode circuitry in peripheral circuitry 212 such that memory cells in memory array 211 are accessed either before or after the memory cells in memory array 221.

In alternative embodiments of the present invention, memory 15 may be tailored, either permanently or dynamically so that memory array 211 and memory array 221 are logically separated each other in an address map. In yet other embodiments, memory array 221 may comprise memory cells of a type different than the memory cells of memory array 211, although the scope of the present invention is not limited in this respect. For example, memory array 221 may comprise one or more of the memory types described earlier.

As shown in the particular embodiment of FIG. 2, integrated circuit 220 does not include peripheral circuitry, although the scope of the present invention is not limited in this respect. For example, peripheral circuitry 212 of integrated circuit 210 may be used to control the operation of memory array 221. For example, peripheral circuitry 212 may be relied upon to provide operations such as address decoding, address and or data latching, bussing, clocking, synchronizing, security, power supply potentials, program and/or erasing voltage potentials, electrostatic discharge (ESD) protection, error code correction (ECC), input/output (I/O) buffering, etc., for memory array 221.

For example, peripheral circuitry 212 may include sense amps that may be used to read the data stored in memory array 211. In one particular embodiment, although not necessarily all, at least some of the sense amps may be used to read or sense the data stored in memory array 221.

In another embodiment, peripheral circuitry 212 may include circuitry that may be used to program and/or erase the data stored in the memory cells of memory array 211. In one particular embodiment, although not necessarily all, this circuitry may also be used to provide programming or erasing voltage potentials to program or erase the memory cells of memory array 221.

In yet another embodiment, peripheral circuitry 212 may include decode circuitry that may be used to read and/or write data in the memory cells of memory array 211. In one particular embodiment, although not necessarily all, this circuitry may also be used to decode addresses to read and/or write data into the memory cells of memory array 221.

In the particular embodiment shown in FIG. 2, integrated circuit may only contain memory array 221. This may be desirable to reduce the number of transistors or reduce the physical size of memory array 220. This, in turn, may reduce the overall size and/or cost associated with memory array 15, although the scope of the present invention is not limited in this respect. In alternative embodiments, integrated circuit 220 may comprise peripheral circuitry that provides all or a subset of the operations provided by peripheral 212. In addition, memory 15 may comprise additional integrated circuits (not shown) that may also be electrically coupled to integrated circuit, and thus, operatively coupled to peripheral circuitry 212.

In yet another embodiment, peripheral circuitry 212 may be integrated into another integrated circuit within computing device 50. For example, peripheral circuitry 212 may be part of processor 10 (see FIG. 1), transceiver 12, or another integrated circuit. In other words, the peripheral circuitry may be part of an integrated circuit that is separate from the integrated circuit comprising the memory array whose operation is controller by the peripheral circuitry. This particular embodiment may be desirable because then a variety of memory arrays may be manufactured separately from the periphery circuitry. In addition, the periphery circuitry may be modified to alter the operation for the memory array. For example, the same memory array may be couple to one processor where the periphery circuitry operates the memory as single bit per cell flash memory, whereas if the same type of memory array were coupled to another integrated circuit with different periphery circuitry, it may operate a multi-level cell flash (i.e. two or more bits stored per cell), although the scope of the present invention is not limited in this respect.

Figure 3:
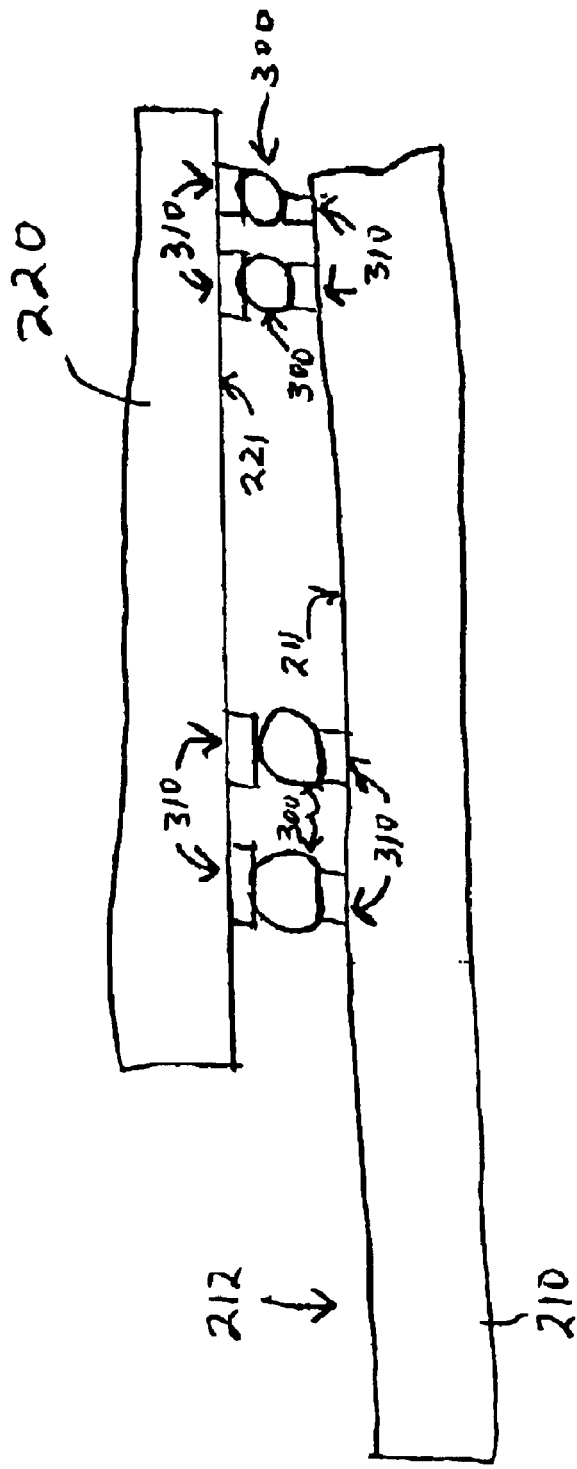
FIGS. 3–4 are side views of alternative embodiments of the present invention.

Turning to FIG. 3, an embodiment for coupling integrated circuit 210 to integrated circuit 220 is provided. Although the scope of the present invention is not limited in this respect, solder balls 300 or other electrically conductive material may be used to electrically connect bonding pads 310 on integrated circuits 210 and 220. Thus, solder balls 310 may permit electrical signals and/or voltage potentials to pass from peripheral circuitry 212 to control or access memory array 221 of integrated circuit 220. It should be noted that although FIG. 3 illustrates that at least a portion of memory array 221 is overlying memory array 211, the scope of the present invention is not limited in this respect as alternative arrangements depending on the placement of integrated circuits 210–220 and/or solder balls 200 are possible. In alternative and optional embodiments, additional integrated circuits with or without additional memory arrays may also be stacked onto integrated circuits 210 or 220 thereby further increasing the overall size of memory 15.

Figure 4:
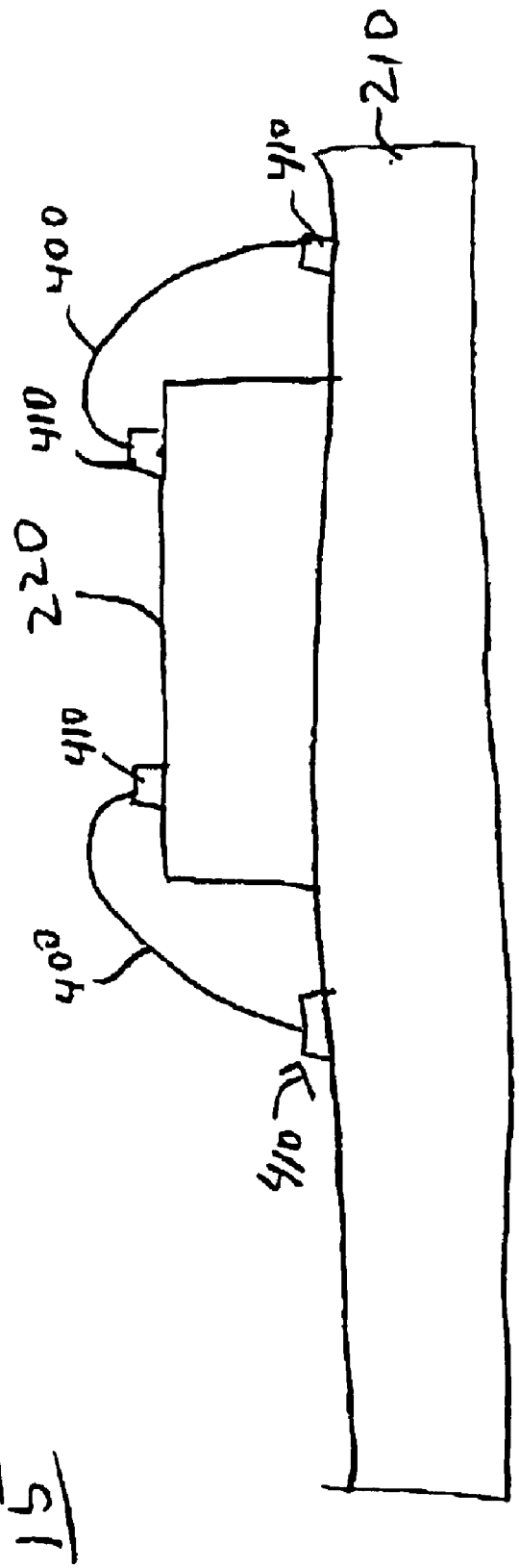

FIG. 4 illustrates yet another arrangement to connect integrated circuits 210 and 220 together. In this particular embodiment, integrated circuit 220 may be mounted on a portion of integrated circuit 210 and wire bonds 400 may be used to electrically connect bonding pads 410 together. Optionally, a insulating material, such as a passivation layer may be formed between integrated circuits 210 and 220 to provide electrical isolation. Bonding wires 400 may provide electrical connection so that either signals and/or voltage potentials from peripheral circuitry 212 (see FIG. 2) may be provided to memory array 221 of integrated circuit 220.

By now it should be appreciated that the present invention provides circuits and methods by which the peripheral circuitry of one integrated circuit may be used to access or operate a memory array on another integrated circuit. The reuse of peripheral circuitry, in turn, may reduce the amount of circuitry that is on the second or subsequent integrated circuits, thereby reducing the costs associated the memory device. In addition, particular embodiments of the present invention may also reduce the overall footprint associated with a memory device since memory arrays may be stacked overlying each other.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
   a first integrated circuit comprising a non-volatile memory array and peripheral circuitry; and
   a second integrated circuit comprising a non-volatile memory array, wherein the non-volatile memory array of the second integrated circuit is operatively coupled to the peripheral circuitry of the first integrated circuit.

2. The apparatus of claim 1, wherein the peripheral circuitry of the first integrated circuit comprises sense amps to sense data stored in the non-volatile memory array of the second integrated circuit.

3. The apparatus of claim 1, wherein the peripheral circuitry of the first integrated circuit comprises circuitry to provide programming voltages to store data in the non-volatile memory array of the second integrated circuit.

4. The apparatus of claim 1, wherein the peripheral circuitry of the first integrated circuit comprises decode circuitry to access memory cells in the non-volatile memory array of the second integrated circuit.

5. The apparatus of claim 1, wherein the first integrated circuit and the second integrated circuit are adapted such that the non-volatile memory array of first integrated circuit is adjacent to the non-volatile memory array of the second integrated circuit logically in an address map.

6. The apparatus of claim 1, wherein the first integrated circuit and the second integrated circuit are adapted such that the non-volatile memory array of first integrated circuit is logically separated from the non-volatile memory array of the second integrated circuit in an address map.

7. The apparatus of claim 1, wherein the non-volatile memory array of the first integrated circuit comprises flash memory cells.

8. The apparatus of claim 7, wherein the non-volatile memory array of the second integrated circuit comprises flash memory cells.

9. The apparatus of claim 7, wherein the non-volatile memory array of the second integrated circuit comprises memory cells other than flash memory cells.

10. The apparatus of claim 1, wherein the second integrated circuit is bonded to the first integrated circuit such that at least a portion of the non-volatile memory array of the second integrated circuit is overlying the non-volatile memory array of the first integrated circuit.

11. The apparatus of claim 10, further comprising solder balls to bond the second integrated circuit to the first integrated circuit.

12. The apparatus of claim 10, further comprising wire bonds to bond the second integrated circuit to the first integrated circuit.

13. The apparatus of claim 1, further comprising a third integrated circuit having a non-volatile memory array operatively coupled to the peripheral circuitry of the first integrated circuit.

14. An apparatus comprising:
    a first integrated circuit comprising peripheral circuitry; and
    a second integrated circuit comprising a memory array, wherein the memory array is operatively coupled to the peripheral circuitry of the first integrated circuit.

15. The apparatus of claim 14, further comprising a third integrated circuit having a memory array operatively coupled to the peripheral circuitry of the first integrated circuit.

16. The apparatus of claim 14, wherein the peripheral circuitry of the first integrated circuit comprises sense amps to sense data stored in the memory array of the second integrated circuit.

17. The apparatus of claim 14, wherein the peripheral circuitry of the first integrated circuit comprises circuitry to provide programming voltages to store data in the memory array of the second integrated circuit.

18. The apparatus of claim 14, wherein the peripheral circuitry of the first integrated circuit comprises decode circuitry to access memory cells in the memory array of the second integrated circuit.

19. The apparatus of claim 14, wherein the memory array of the second integrated circuit comprises flash memory cells.

20. The apparatus of claim 14, wherein the memory array of the second integrated circuit comprises volatile memory cells.

21. An apparatus comprising:
    a first integrated circuit comprising peripheral circuitry;
    a second integrated circuit comprising a non-volatile memory array, wherein the non-volatile memory array is operatively coupled to the peripheral circuitry of the first integrated circuit; and a code division multiple access (CDMA) transceiver to communicate in accordance with information stored in the memory array of the second integrated circuit.

22. The apparatus of claim 21, wherein the peripheral circuitry of the first integrated circuit comprises sense amps to sense data stored in the non-volatile memory array of the second integrated circuit.

23. The apparatus of claim 21, wherein the peripheral circuitry of the first integrated circuit comprises circuitry to provide programming voltages to store data in the non-volatile memory array of the second integrated circuit.

24. The apparatus of claim 21, wherein the peripheral circuitry of the first integrated circuit comprises decode circuitry to access memory cells in the non-volatile memory array of the second integrated circuit.

25. The apparatus of claim 21, wherein the non-volatile memory array of the second integrated circuit comprises flash memory cells.

26. The apparatus of claim 21, wherein the first integrated circuit and the second integrated circuit are coupled to the same power supply voltage potentials.

* * * * *